June 28, 1966 E. E. CANDILIS 3,258,611

VARIABLE RISE AND FALL TIME PULSE GENERATOR

Filed Nov. 18, 1963 2 Sheets-Sheet 1

INVENTOR
EMMANUEL E. CANDILIS
BY A. C. Smith
AGENT

VARIABLE RISE AND FALL TIME PULSE GENERATOR

Filed Nov. 18, 1963 2 Sheets-Sheet 2

INVENTOR
EMMANUEL E. CANDILIS
BY A. C. Smith
AGENT 3,258,611
Patented June 28, 1966

3,258,611

VARIABLE RISE AND FALL TIME PULSE GENERATOR

Emmanuel Evangelos Candilis, Palo Alto, Calif., assignor to Hewlett-Packard Company, Palo Alto, Calif., a corporation of California Filed Nov. 18, 1963, Ser. No. 324,285
9 Claims. (Cl. 307—88.5)

This invention relates to a pulse forming circuit of a type used to generate output pulses having a variable rise and fall time.

Circuits which provide output pulses having a variable rise and fall time are known. Typically, however, these circuits do not provide for independently varying the rise time and the fall time of an individual output pulse. The minimum rise time or fall time generally provided by these circuits is about twenty nanoseconds ($20\times10^{-9}$ seconds). Their maximum frequency range is from a few cycles per second to approximately fifty megacycles per second. A faster rise and fall time, which are independently variable, and a greater frequency range are necessary for certain applications. For example, it may be desirable to know how a circuit responds over a broad frequency range to input pulses having selected rise and fall times.

It is the principal object of this invention to provide a circuit for forming an output pulse having an independently variable rise time and fall time. Another object of this invention is to provide a pulse forming circuit capable of providing extremely fast rise and fall times. Still another object of this invention is to provide a variable rise and fall time pulse generator having a substantially increased repetition frequency range.

In accordance with the illustrated embodiment of this invention, there is provided a circuit including a trigger, an impulse burst generator, and a pulse synthesizing network to provide an output pulse having an independently selected rise time and fall time.

Other and incidental objects of this invention will be apparent from a reading of this specification and an inspection of the accompanying drawing in which.

Figure 1:
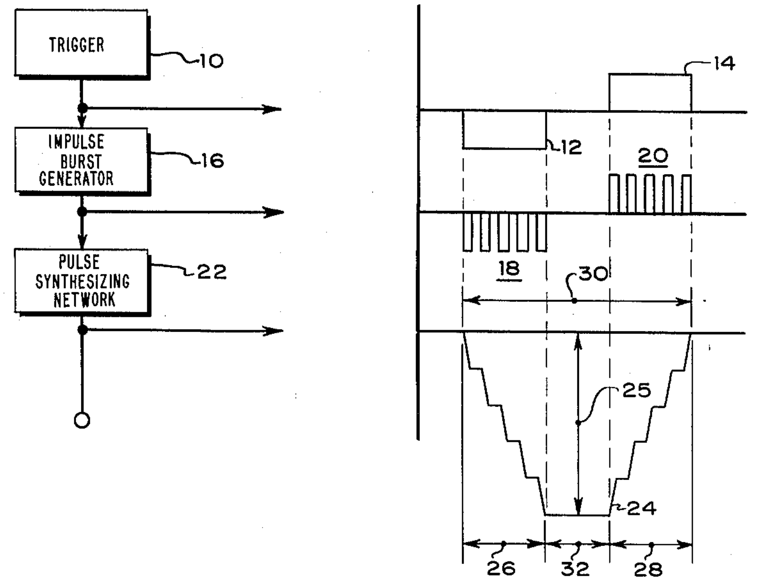
FIGURE 1 is a block diagram of a circuit for forming an output pulse having an independently selected rise and fall time in accordance with this invention.

Referring to FIGURE 1, the trigger 10 generates a start pulse 12 of one polarity and a stop pulse 14 of opposite polarity. These pulses are applied to the input of an impulse burst generator 16. The generator 16 forms a first burst of impulses 18 having a selected repetition frequency in response to the start pulse 12. Similarly, the generator 16 forms a second burst of impulses 20 having a selected repetition frequency in response to the stop pulse 14. The first impulse burst 18 and the second impulse burst 20 are applied to the input of a pulse synthesizing network 22. An output pulse 24 is synthesized by the network 22 in response to discrete impulses of the first and second impulse bursts 18 and 20.

The magnitude 25 of the output pulse 24 is determined by the number of discrete impulses that are utilized by the network 22 in synthesizing the output pulse 24. The number of discrete impulses that may be generated to form the first and second impulse bursts 18 and 20 is determined by the start and the stop pulse duration respectively, and by the impulse repetition frequency. Circuit means are included within the trigger 10 to provide for independently varying the duration of the start and stop pulses 12 and 14. Thus, for a selected impulse repetition frequency the number of impulses forming the impulse bursts 18 and 20 may be varied. This provides a way of changing the magnitude 25 of the output pulse 24 in discrete steps.

The rise time 26 is of the output pulse 24 synthesized by the network 22 is determined by the repetition frequency of the first impulse burst 18. Circuit means for varying the repetition frequency of the impulses forming the first impulse burst 18 are therefore included within the generator 16 to provide a variable rise time 26. Similiarly, the fall time 28 of the output pulse 24 is determined by the repetition frequency of the second impulse burst 20. The impulse burst generator 16 also includes circuit means for varying the repetition frequency of the impulses forming the second impulse burst 20 to provide an independently variable fall time 28.

The basewidth 30 of the output pulse 24 is defined by the sum of the fall time 28 and the interval between the leading edge of the start pulse 12 and the leading edge of the stop pulse 14. The trigger 10 includes circuit means for varying this interval to provide an output pulse 24 with a variable basewidth 30. The duration 32 of the output pulse is defined by the basewidth 30 less the sum of the rise time 26 and the fall time 28.

Figure 2:
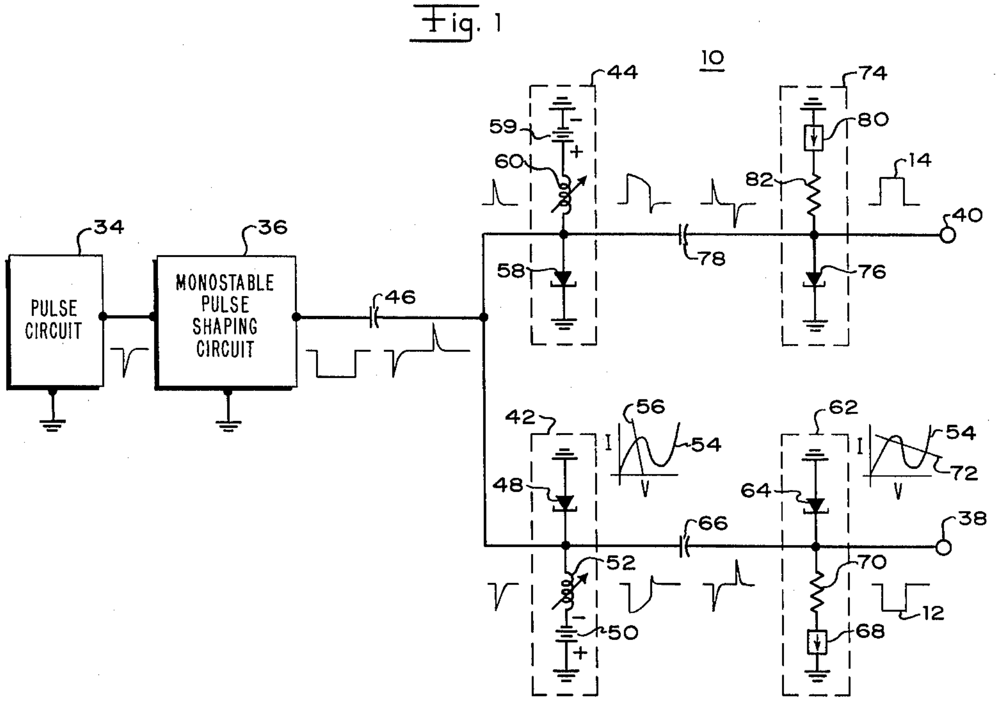
FIGURE 2 is a circuit diagram of the trigger of FIGURE 1.

Referring to FIGURE 2, the circuit diagram of a suitable trigger 10 is shown. Block 34 represents a pulse circuit which may be either free running or externally triggered. For example, a broad frequency range pulse circuit which is capable of supplying pulses within a range of repetition frequencies from a few cycles per second to a few hundred megacycles per second may be used. The output of the pulse circuit 34 is connected to the input of a monostable pulse shaping circuit represented by the block 36. The monostable pulse shaping circuit 36 forms a rectangular pulse of selected duration in response to each of the pulses generated by the pulse circuit 34. The duration of each of these rectangular pulses determines the interval between the leading edge of a start pulse 12 and the leading edge of a stop pulse 14 which appear at the output terminals 38 and 40 of the trigger 10. Therefore, a conventional circuit means are included in the shaping circuit 36 for varying the duration of the rectangular pulses produced thereby to provide for the selection of this interval.

The output of the shaping circuit 36 is connected to a point common to the inputs of a pair of parallel connected monostable circuits 42 and 44 by a coupling capacitor 46. Monostable circuit 42 includes a tunnel diode 48 which is shunted by a serially connected voltage source 50 and variable inductor 52. The cathode of the tunnel diode 48 is connected to the negative terminal of the voltage source 50 by the variable inductor 52 and its anode is connected to ground potential. Tunnel diodes show in their current-voltage characteristic 54 a region of negative resistance between adjacent low and high voltage regions of positive resistance. The tunnel diode 48 is biased by the voltage source 50 to operate monostably its low voltage region of positive resistance as shown by the load line 56 which is superimposed on its voltage-current characteristic 54. Monostable circuit 44 is similarly connected except that the tunnel diode 58 has its anode connected to the positive terminal of the voltage source 59 by the variable inductor 60 and its cathode connected to ground potential.

A rectangular pulse of selected duration formed by the monostable pulse shaping circuit 36 is differentiated by the series combination of the coupling capacitor 46 and the resistance of the tunnel diodes 48 and 58. This differentiation forms an impulse of negative polarity from the leading edge of the rectangular pulse and an impulse of postive polarity from its trailing edge. The monostable circuit 42 generates a negative polarity pulse in response to the impulse of negative polarity. It is the duration of this pulse which determines the duration of the start pulse 12 appearing at the output terminal 38. The variable inductor 52 controls the duration of the pulse generated by the monostable circuit 42 to provide for the selection of the start pulse duration. Similarly, the monostable circuit 44 generates a positive polarity pulse in response to the impulse of positive polarity. The duration of this pulse determines the duration of the stop pulse 14 appearing at the output terminal 40. The variable inductor 60 controls the duration of the pulse generated by the monostable circuit 44 to provide for the selection of the stop pulse duration.

The output of the monostable circuit 42 is connected to the input of a bistable circuit 62, including a tunnel diode 64, by a coupling capacitor 66. The tunnel diode 64 is shunted by a serially connected direct current source 68 and resistor 70. Its cathode is connected to one end of the resistor 70 and its anode is connected to ground potential. The tunnel diode 64 is biased by the current source 68 to operate bistably in its low and high voltage regions of positive resistance as shown by the load line 72 which is superimposed on its voltage-current characteristic 54. The output of the monostable circuit 44 is connected to the input of as imilar bistable circuit 74, by a coupling capactor 78. However, the tunnel diode 76 has its anode connected to one end of the resistor 82 and its cathode connected to ground potential.

The negative polarity pulse of selected duration generated by the monostable circuit 42 is differentiated by the series combination of the coupling capacitor 66 and the resistance of the tunnel diode 64. This differentiation forms an impulse of negative polarity from the leading edge of the pulse and an impulse of positive polarity from its trailing edge. These negative and positive impulses alternately trgger the bistable circuit 62 causing it to generate a rectangular start pulse 12 having the selected duration. Similarly, the bistable circuit 74 generates a rectangular stop pulse 14 having a selected duration in response to the positive polarity pulse of selected duration generated by the monostable circuit 44.

Figure 3:
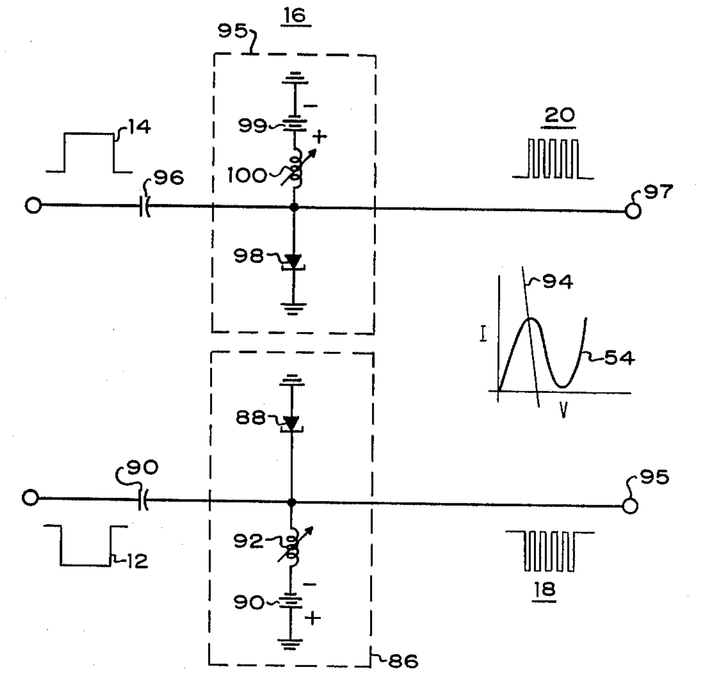
FIGURE 3 is a circuit diagram of the impulse burst generator of FIGURE 1.

Referring to FIGURE 3, a suitable impulse burst generator 16 is shown. The output terminal 38 of the trigger 10 is connected to the input of a monostable circuit 86, by the coupling capacitor 90. A capacitor of large value is used as the coupling capacitor 90 to minimize differentation of the start pulse 12. The monostable circuit 86 comprises a tunnel diode 88 which is shunted by a serially connected voltage source 90 and variable inductor 92. The cathode of the tunnel diode 88 is connected to the negative terminal of the voltage source 90 by the variable inductor 92 and its anode is connected to ground potential. The tunnel diode is biased by the voltage source 90 to operate monostably in its low voltage region of positive resistance as shown by the load line 94 which is superimposed on its voltage-current characteristic 54. The monostable circuit 86 generates a burst of negative polarity impulses 18, which appears at its output terminal 95, in response to the negative polarity start pulse 12. The repetition frequency of these impulses is determined by the setting of the variable inductor 92. Since the monostable circuit 86 free runs for the duration of the start pulse 12, the duration of the impulse burst 18 is selected by varying the duration of the start pulse 12. Ths is done by changing the setting of the variable inductor 52 of FIGURE 2.

The output terminal 40 of the trigger 10 is connected to the input of a similar monostable circuit 95 by a coupling capacitor 96 of large value. However, the tunnel diode 98 has its anode connected to the positive terminal of the voltage source 99 and its cathode connected to ground potential. The monostable circuit 95 generates a burst of postive polarity impulses 20 in response to the positive polarity stop pulse 14. This impulse burst appears at the output terminal 97. The repetition frequency of these impulses is determined by the setting of a variable inductor 100. The duration of the impulse burst 20 is selected by varying the duration of the stop pulse 14. This is done by changing the setting of the variable inductor 60 of FIGURE 2.

Figure 4:
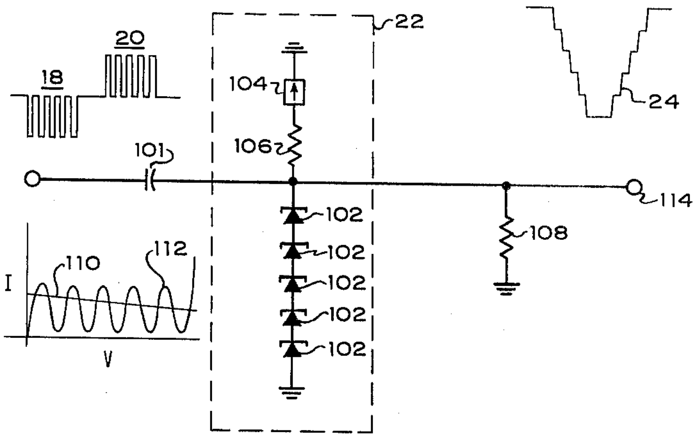
FIGURE 4 is a circuit diagram of the pulse synthesizing network of FIGURE 1.

Referring to FIGURE 4, a suitable pulse synthesizing network 22 is shown. The output terminals 95 and 97 of the monostable circuits 86 and 95 of FIGURE 3 are connected in common to the input of the pulse synthesizing network 22 by the coupling capacitor 101. A capacitor of large value is used as the coupling capacitor 101 to minimize differentiation of the discrete impulses forming the negative and positive polarity impulse burst 18 and 20. The pulse synthesizing network 22 comprises a string of five, for example, serially connected tunnel diodes 102 which is shunted by a serially connected direct current source 104 and resistor 106. The cathode of the first tunnel diode 102 is connected to one end of the resistor 106 and the anode of the last tunnel diode 102 is connected to ground potential. Each of the diodes 102 is biased by the current source 104 to operate around the middle of its low voltage region of positive resistance as shown by the load line 110 which is superimposed on the composite voltage-current characteristic 112. A load resistor 108 is connected across the output of the pulse synthesizing network 22.

Before the negative impulse burst 18 is applied the coupling capacitor 101 is charged to the voltage across the string of serially connected diodes 102. One of the tunnel diodes 102 is triggered to its high voltage region of positive resistance in response to the first impulse of the negative impulse burst 18, assuming the impulse is of sufficient magnitude. Thus, the voltage across the string of serially connected tunnel diodes 102 is substantially increased. This causes the coupling capacitor 101 to charge towards the increased voltage appearing across the string of serially connected tunnel diodes 102 thereby preventing the impulse from triggering others of the tunnel diodes 102. If the width of the impulse is small compared to the time constant of the charging circuit of the coupling capacitor 101, the impulse will not be able to trigger additional diodes 102.

The triggering of one of the diodes 102 in this manner provides a negative voltage step at the output terminal 114. This step has a rise time substantially equal to the switching time of the tunnel diode 102 which was triggered. Similarly, each successive impulse of the negative polarity impulse burst 18 triggers another tunnel diode 102 thereby providing an additional negative voltage step at the output terminal 114. If the negative impulse burst comprises sufficient discrete impulses all of the tunnel diodes 102 are triggered. The composite negative voltage step synthesized from discrete impulses of the negative impulse burst 18 defines the rise time of the output pulse 24. The rise time may be selected by varying the repetition frequency of the impulses comprising the negative impulse burst 18.

The tunnel diodes 102 are similarly triggered one at a time back to their low voltage region of positive resistance in response to discrete impulses of the positive impulse burst 20. This provides a composite positive voltage step which defines the fall time of the output pulse 24. The fall time may be selected by varying the repetition frequency of the impulses comprising the positive impulse burst 20.

Any number of tunnel diodes 102 may be used to form the string of serially connected tunnel diodes 102 included in the pulse synthesizing network 22. Assuming the tunnel diodes 102 are each biased for operation at a similar voltage level when triggered to their high voltage region of positive resistance (that each has a similar forward voltage) then the magnitude of the output pulse 24 depends on the number of tunnel diodes 102 that are triggered. By varying the duration of the impulse bursts 18 and 20 the number of discrete impulses of a selected repetition frequency forming the impulse bursts 18 and 20 is changed. This changes the number of tunnel diodes 102 that may be triggered and provides a way of selecting the magnitude of the output pulse 24 in discrete steps. The basewidth of the output pulse 24 is selected by varying the interval between the leading edge of the negative polarity impulse burst 18 and the leading edge of the positive polarity impulse burst 20.

If, for example, five tunnel diodes having a switching speed less than two-tenths of a nanosecond and a peak current rating of about one-tenth of an ampere are used, it is possible to obtain an output pulse 24 having a magnitude of the order of 4 volts into 50 ohms and a rise and fall time of the order of one nanosecond.

I claim:

1. A circuit for forming an output pulse having a selected rise and fall time, said circuit comprising:
   means responsive to a start pulse and a stop pulse separated by a selected time interval for generating rerespectively a first impulse burst and a second impulse burst correspondingly separated in time,
   said first impulse burst comprising discrete impulses having a repetition frequency which determines the rise time of said output pulse,
   said second impulse burst comprising discrete impulses the repetition frequency of which determines the fall time of said output pulse,
   means for varying the repetition frequency of said discrete impulses to provide said selected rise and fall time, and
   means responsive to said first impulse burst and said second impulse burst to synthesize therefrom said output pulse with the leading edge of said first impulse burst beginning the time interval defining said selected rise time and the leading edge of said second impulse burst beginning the time interval defining said selected fall time.

2. A circuit for forming an output pulse having a selected rise and fall time, said circuit comprising:
   a generator responsive to a start pulse and a stop pulse separated by a selected time interval for generating respectively a first impulse burst and a second impulse burst correspondingly separated in time,
   said first impulse burst comprising discrete impulses having a repetition frequency which determines the rise time of said output pulse,
   said second impulse burst comprising discrete impulses the repetition frequency of which determines the fall time of said output pulse,
   means for varying the repetition frequency of said discrete impulses to provide said selected rise and fall time, and
   a network connected to said generator to synthesize said output pulse having said selected rise and fall time in response to discrete impulses of said first and second impulse bursts with the leading edge of said first impulse burst beginning the time interval defining said selected rise time and the leading edge of said second impulse burst beginning the time interval defining said selected fall time.

3. A circuit for forming an output pulse having a selected rise time and an independently selected fall time, said circuit comprising:
   a trigger to generate a start pulse and a stop pulse separated by a selected time interval,
   means responsive to said start pulse and said stop pulse to generate respectively a first impulse burst and a second impulse burst correspondingly separated in time,
   said first impulse burst comprising discrete impulses having a repetition frequency which determines the rise time of said output pulse,
   means for varying the repetition frequency of the discrete impulses forming said first impulse burst to provide said selected rise time,
   said second impulse burst comprising discrete impulses the repetition frequency of which determines the fall time of said output pulse,
   means for varying the repetition frequency of the discrete impulses forming said second impulse burst to provide said selected fall time, and
   means responsive to said first impulse burst and said second impulse burst to synthesize therefrom said output pulse with the leading edge of said first impulse burst beginning the time interval defining said selected rise time and the leading edge of said second impulse burst beginning the time interval defining said selected fall time.

4. A circuit for forming an output pulse having a selected rise time and an independently selected fall time, said circuit comprising:
   a trigger to generate a start pulse and a stop pulse the leading edges of which are separated by a selected time interval,
   circuit means for selecting the duration of said start pulse and said stop pulse,
   circuit means for selecting the interval between the leading edge of said start pulse and the leading edge of said stop pulse,
   means responsive to said start pulse and said stop pulse to generate respectively a first impulse burst and a second impulse burst correspondingly separated in time,
   the duration of said first impulse burst and said second impulse burst being fixed respectively by the duration of said start pulse and said stop pulse,
   the interval between the leading edge of said first impulse burst and the leading edge of said second impulse burst being fixed by the interval between the leading edge of said start pulse and the leading edge of said stop pulse,
   said first impulse burst comprising discrete impulses having a repetition frequency which detemines the rise time of said output pulse,
   circuit means for varying the repetition frequency of the discrete impulses forming said first impulse burst to provide said selected rise time,
   said second impulse burst comprising discrete impulses the repetition frequency of which determines the fall time of said output pulse,
   circuit means for varying the repetition frequency of the discrete impulses forming said second impulse burst to provide said selected fall time, and
   means responsive to said first impulse burst and said second impulse burst to synthesize therefrom said output pulse with the leading edge of said first impulse burst beginning the time interval defining said selected rise time and the leading edge of said second impulse burst beginning the time interval defining said selected fall time.

5. A circuit for forming an output pulse having a selected rise time and an independently selected fall time, said circuit comprising:
   a trigger to generate a start pulse of one polarity and a stop pulse of opposite polarity,
   circuit means for selecting the duration of said start pulse and said stop pulse,
   circuit means for selecting the interval between the leading edge of said start pulse and the leading edge of said stop pulse,
   means responsive to said start pulse and said stop pulse to generate respectively a first impulse burst of one polarity and a second impulse burst of opposite polarity,
   the duration of said first impulse burst and said second impulse burst being fixed respectively by the duration of said start pulse and said stop pulse,
   the interval between the leading edge of said first impulse burst and the leading edge of said second impulse burst being fixed by the interval between the leading edge of said start pulse and the leading edge of said stop pulse, said first impulse burst comprising discrete impulses having a repetition frequency which determines the rise time of said output pulse, circuit means for varying the repetition frequency of the discrete impulses forming said first impulse burst to provide said selected rise time, said second impulse burst comprising discrete impulses the repetition frequency of which determines the fall time of said output pulse, circuit means for varying the repetition frequency of the discrete impulses forming said second impulse burst to provide said selected fall time, means responsive to said first impulse burst and said second impulse burst to synthesize therefrom said output pulse having said selected rise and fall time, the basewidth of said output pulse being defined by the sum of the fall time and the interval between the leading edge of said first impulse burst and the leading edge of said second impulse burst, the duration of said output pulse being defined by said basewidth less the sum of said rise time and said fall time, and the magnitude of said output pulse being determined by the repetition frequency of the discrete impulses forming said first and second impulse bursts and the duration of said impulse bursts.

6. A circuit for forming an output pulse having a selected rise time and an independently selected fall time, said circuit comprising:

a trigger to generate a start pulse of one polarity and a stop pulse of opposite polarity, circuit means for selecting the duration of said start pulse and said stop pulse, circuit means for selecting the interval between the leading edge of said start pulse and the leading edge of said stop pulse, means responsive to said start pulse and said stop pulse to generate respectively a first impulse burst of one polarity and a second impulse burst of opposite polarity, the duration of said first impulse burst and said second impulse burst being fixed respectively by the duration of said start pulse and said stop pulse, the interval between the leading edge of said first impulse burst and the leading edge of said second impulse burst being fixed by the interval between the leading edge of said start pulse and the leading edge of said stop pulse, said first impulse burst comprising discrete impulses having a repetition frequency which determines the rise time of said output pulse, circuit means for varying the repetition frequency of the discrete impulses forming said first impulse burst to provide said selected rise time, said second impulse burst comprising discrete impulses the repetition frequency of which determines the fall time of said output pulse, circuit means for varying the repetition frequency of the discrete impulses forming said second impulse burst to provide said selected fall time, means, including serially connected tunnel diodes, to synthesize said output pulse having said selected rise and fall time in response to the discrete impulses forming said first and second impulse bursts, the basewidth of said output pulse being defined by the sum of the fall time and the interval between the leading edge of said first impulse burst and the leading edge of said second impulse burst, the duration of said output pulse being defined by said basewidth less the sum of said rise time and said fall time, and the magnitude of said output pulse being determined by the repetition frequency of the discrete impulses forming said first and second impulse bursts, the duration of said impulse bursts, and the forward voltage of said tunnel diodes.

7. A circuit for forming an output pulse having a selected rise time and an independently selected fall time, said circuit comprising:

a trigger to generate a start pulse of one polarity and a stop pulse of opposite polarity, an impulse burst generator to generate respectively a first impulse burst of one polarity and a second impulse burst of opposite polarity in response to said start pulse and said stop pulse, said first impulse burst comprising discrete impulses having a repetition frequency which determines the rise time of said output pulse, said second impulse burst comprising discrete impulses having a repetition frequency which determines te fall time of said output pulse, said generator including inductive means for varying the repetition frequency of the discrete impulses forming said impulse bursts to provide said selected rise time and said independently selected fall time, a pulse synthesizing network to form said output pulse having said independently selected rise time and fall time in response to discrete impulses of said impulse bursts, said network including a string of tunnel diodes and a source of bias current in parallel connection, said tunnel diodes showing in their current-voltage characteristic a region of negative resistance between adjacent regions of positive resistance, each of said tunnel diodes being biased for bistable operation in said low and high voltage regions of positive resistance, one of said tunnel diodes switching from operation in one of said voltage regions to operation in the other of said voltage regions in response to one of the discreate impulses of said impulse bursts, the switching of a discrete number of said tunnel diodes from one of said voltage regions to the other of said voltage regions in response to discrete impulses of said impulse bursts providing said output pulse.

8. A circuit for forming an output pulse having a selected rise time and an independently selected fall time, said circuit comprising:

a trigger to generate a start pulse of one polarity and a stop pulse of opposite polarity, an impulse burst generator to generate respectively a first impulse burst of one polarity and a second impulse burst of opposite polarity in response to said start pulse and said stop pulse, said first impulse burst comprising discrete impulses having a repetition frequency which determines the rise time of said output pulse, said second impulse burst comprising discrete impulses having a repetition frequency which determines the fall time of said output pulse, said generator including inductive means for varying the repetition frequency of the discrete impulses forming said impulse bursts to provide said selected rise time and said independently selected fall time, a pulse synthesizing network to form said output pulse having said independently selected rise time and fall time in response to discrete impulses of said impulse bursts, said network including a string of tunnel diodes and a source of bias current in parallel connection, said tunnel diodes showing in their current-voltage characteristic a region of negative resistance between adjacent regions of positive resistance, each of said tunnel diodes being biased initially for operation in said low voltage region of positive resistance, one of said tunnel diodes switching from operation in said low voltage region to operation in said high voltage region in response to one of the discrete impulses of said first impulse burst, the switching of a discrete number of said tunnel diodes from said low voltage region to said high voltage region in response to discrete impulses of said first impulse burst providing the leading edge of said output pulse, one of said tunnel diodes switching from operation in said high voltage region to operation in said low voltage region in response to one of the discrete impulses of said second impulse burst, the switching of a discrete number of said tunnel diodes from said high voltage region to said low voltage region in response to discrete impulses of said second impulse burst providing the trailing edge of said output pulse.

9. A circuit for forming an output pulse having a selected rise time and an independently selected fall time, said circuit comprising:

a trigger to generate a start pulse of one polarity and a stop pulse of opposite polarity, said trigger including first inductive means to provide a start pulse and a stop pulse having a selected duration, said trigger including second inductive means to provide a selected interval between the leading edge of said start pulse and the leading edge of said stop pulse, an impulse burst generator to generate respectively a first impulse burst of one polarity and a second impulse burst of opposite polarity in response to said start pulse and said stop pulse, said first impulse burst comprising discrete impulses having a repetition frequency which determines the rise time of said output pulse, said second impulse burst comprising discrete impulses having a repetition frequency which determines the fall time of said output pulse, said generator including third inductive means for varying the repetition frequency of the discrete impulses forming said impulse bursts to provide said selected rise time and said independently selected fall time, a pulse synthesizing network to form said output pulse having said independently selected rise time and fall time in response to discrete impulses of said impulse bursts, said network including a string of tunnel diodes and a source of bias current in parallel connection, said tunnel diodes showing in their current-voltage characteristic a region of negative resistance between adjacent regions of positive resistance, each of said tunnel diodes being biased initially for operation in said low voltage region of positive resistance, one of said tunnel diodes switching from operation in said low voltage region to operation in said high voltage region in response to one of the discrete impulses of said first impulse burst, the switching of a discrete number of said tunnel diodes from said low voltage region to said high voltage region in response to discrete impulses of said first impulse burst providing the leading edge of said output pulse, one of said tunnel diodes switching from operation in said high voltage region to operation in said low voltage region in response to one of the discrete impulses of said second impulse burst, the switching of a discrete number of said tunnel diodes from said high voltage region to said low voltage region in response to discrete impulses of said second impulse burst providing the trailing edge of said output pulse.

References Cited by the Examiner

UNITED STATES PATENTS

| | | | |
|---|---|---|---|
| 2,562,694 | 7/1951 | Brown | 328—186 X |
| 2,596,149 | 5/1952 | Hilferty | 328—186 |
| 3,142,765 | 7/1964 | Wine | 307—88.5 |

ARTHUR GAUSS, *Primary Examiner.*

S. D. MILLER, J. HEYMAN, *Assistant Examiners.*